(12) United States Patent
Hill

(10) Patent No.: US 7,321,432 B2
(45) Date of Patent: Jan. 22, 2008

(54) MEASUREMENT AND COMPENSATION OF ERRORS IN INTERFEROMETERS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 367 days.

(21) Appl. No.: 10/659,103

(22) Filed: Sep. 9, 2003

(65) Prior Publication Data

US 2004/0085546 A1    May 6, 2004

Related U.S. Application Data

(60) Provisional application No. 60/409,285, filed on Sep. 9, 2002.

(51) Int. Cl.
*G01B 11/14* (2006.01)

(52) U.S. Cl. .................................. 356/500

(58) Field of Classification Search ............ 356/401, 356/487, 490, 498, 500, 508–510; 355/53; 250/559.3, 559.37
See application file for complete search history.

(56) References Cited

U.S. PATENT DOCUMENTS

| | | |
|---|---|---|
| 4,606,638 A | 8/1986 | Sommargren |
| 4,662,750 A | 5/1987 | Barger |
| 4,711,573 A | 12/1987 | Wijntjes et al. |
| 4,790,651 A | 12/1988 | Brown et al. |
| 4,802,765 A | 2/1989 | Young et al. |
| 4,859,066 A | 8/1989 | Sommargren |
| 4,881,816 A | 11/1989 | Zanoni |
| 5,064,289 A | 11/1991 | Bockman |
| 5,114,234 A | 5/1992 | Otsuka et al. |
| 5,151,749 A | 9/1992 | Tanimoto et al. |
| 5,187,543 A | 2/1993 | Ebert |
| 5,363,196 A | 11/1994 | Cameron |
| 5,408,318 A | 4/1995 | Slater |
| 5,491,550 A | 2/1996 | Dabbs |
| 5,663,793 A | 9/1997 | de Groot |
| 5,663,893 A | 9/1997 | Wampler et al. |

(Continued)

FOREIGN PATENT DOCUMENTS

JP    7-351078    12/1995

(Continued)

OTHER PUBLICATIONS

Bennett, S.J., "A Double-Passed Michelson Interferometer." Optics Communications, 4:6, pp. 428-430, 1972.

(Continued)

*Primary Examiner*—Samuel A. Turner
(74) *Attorney, Agent, or Firm*—Fish & Richardson P.C.

(57) ABSTRACT

In general, in one aspect, the invention features a method for determining the location of an alignment mark on a stage including measuring a location, $x_1$, of a stage along a first measurement axis using an interferometer, measuring a location, $x_2$, of the stage along a second measurement axis substantially parallel to the first measurement axis, and determining a location of the alignment mark along a third axis substantially parallel to the first measurement axis based on $x_1$, $x_2$, and a correction term, $\psi_3$, calculated from predetermined information including information characterizing imperfections in the interferometer.

59 Claims, 8 Drawing Sheets

U.S. PATENT DOCUMENTS

| | | |
|---|---|---|
| 5,724,136 A | 3/1998 | Zanoni |
| 5,757,160 A | 5/1998 | Kreuzer |
| 5,757,489 A | 5/1998 | Kawakami |
| 5,764,361 A | 6/1998 | Kato et al. |
| 5,781,277 A | 7/1998 | Iwamoto |
| 5,790,253 A * | 8/1998 | Kamiya ............... 356/500 |
| 5,801,832 A | 9/1998 | Van Der Brink |
| 6,008,902 A | 12/1999 | Rinn |
| 6,020,964 A | 2/2000 | Loopstra et al. |
| 6,040,096 A | 3/2000 | Kakizaki |
| 6,046,792 A | 4/2000 | Van Der Werf et al. |
| 6,134,007 A | 10/2000 | Naraki et al. |
| 6,137,574 A | 10/2000 | Hill |
| 6,159,644 A | 12/2000 | Satoh et al. |
| 6,181,420 B1 * | 1/2001 | Badami et al. ............ 356/487 |
| 6,236,507 B1 | 5/2001 | Hill et al. |
| 6,246,481 B1 | 6/2001 | Hill |
| 6,252,668 B1 | 6/2001 | Hill |
| 6,304,318 B1 | 10/2001 | Matsumoto |
| 6,330,105 B1 | 12/2001 | Rozelle et al. |
| 2001/0035959 A1 | 11/2001 | Hill |
| 2002/0089671 A1 | 7/2002 | Hill |
| 2003/0090675 A1 | 5/2003 | Fujiwara |
| 2004/0061869 A1 * | 4/2004 | Hill ............... 356/508 |

FOREIGN PATENT DOCUMENTS

| | | |
|---|---|---|
| JP | 8-117083 | 4/1996 |
| JP | 10-260009 | 9/1998 |
| WO | WO 01/90686 | 11/2001 |

OTHER PUBLICATIONS

Wu et al. "Analytical modeling of the periodic nonlinearity in heterodyne interferometry." Applied Optics, 37:28, pp. 6696-6700, 1998.

Hines et al. Sub-Nonometer Laser Metrology—Some Techniques and Models. ESO Conference on High-Resolution Imaging by Interferometry II, pp. 1195-1204, 1991.

Bobroff, Norman. "Recent advances in displacement measuring interferometry." Meas. Sci. Technol. 4, pp. 907-926, 1993.

Oka et al. "Polarization heterodyne interferometry using another local oscillator beam." Optics Communications, 92, pp. 1-5, 1992.

Badami et al. "Investigation of NonLinearity in High Accuracy Heterodyne Laser Interferometry." American Society for Precision Engineering, 1997 Proceedings, 16, pp. 153-156, 1997.

Bobroff, Norman. "Residual errors in laser interferometry from air turbulence and nonlinearity." Applied Optics, 26:13, pp. 2676-2686, 1987.

* cited by examiner

MEASUREMENT AND COMPENSATION OF ERRORS IN INTERFEROMETERS

CROSS REFERENCE TO RELATED APPLICATIONS

This application claims priority to Provisional Patent Application 60/409,285, entitled "IN-SITU MEASUREMENT AND COMPENSATION OF NON-CYCLIC NON-LINEAR ERRORS GENERATED BY BEAM SHEAR IN INTERFEROMETERS," filed on Sep. 9, 2002, the entire contents of which are hereby incorporated by reference.

BACKGROUND

This invention relates to interferometry and to compensating for errors in interferometric measurements.

Distance measuring interferometers monitor changes in the position of a measurement object relative to a reference object based on an optical interference signal. The interferometer generates the optical interference signal by overlapping and interfering a measurement beam reflected from the measurement object with a reference beam reflected from a reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the phase of the measured interference signal correspond to changes in the relative position of the measurement object, e.g., a change in phase of $2\pi$ corresponds substantially to a distance change $L$ of $\lambda/(2np)$. Distance $2L$ is a round-trip distance change or the change in distance to and from a stage that includes the measurement object. In other words, the phase $\Phi$, ideally, is directly proportional to $L$, and can be expressed as $\Phi=2pkL$, for a plane mirror interferometer, e.g., a high stability plane mirror interferometer, where $$k = \frac{2\pi n}{\lambda}$$

and where the measurement beam is normally incident on the measurement object.

Unfortunately, the observable interference phase, $\tilde{\Phi}$, is not always identically equal to phase $\Phi$. Many interferometers include, for example, non-linearities such as those known as "cyclic errors." The cyclic errors can be expressed as contributions to the observable phase and/or the intensity of the measured interference signal and have a sinusoidal dependence on the change in for example optical path length $2pnL$. In particular, a first order cyclic error in phase has for the example a sinusoidal dependence on $(4\pi pnL)/\lambda$ and a second order cyclic error in phase has for the example a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics. Different techniques for quantifying such cyclic errors are described in commonly owned U.S. Pat. Nos. 6,137,574, 6,252,688, and 6,246,481 by Henry A. Hill.

There are in addition to the cyclic errors, non-cyclic non-linearities or non-cyclic errors, so named because they tend to vary in a non-sinusoidal, non-linear way with respect to the optical path length. One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736-757, 1981.

A second source of non-cyclic errors is the effect of "beam shearing" of optical beams across interferometer elements and the lateral shearing of reference and measurement beams one with respect to the other. Beam shears can be caused for example by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

In some embodiments, multiple distance measuring interferometers can be used to monitor multiple degrees of freedom of a measurement object. For example, interferometry systems that include multiple displacement interferometers are used to monitor the location of a plane mirror measurement object in lithography tools. Monitoring the location of a stage mirror relative to two parallel measurement axes provides information about the angular orientation of the stage mirror relative to an axis normal to the plane in which the two measurement axes lie. Such measurements allow a user to monitor the location and orientation of the stage relative to other components of the lithography tool to relatively high accuracy.

SUMMARY

Imperfections in an interferometer, such as surface and bulk imperfections, and surface variations due to imperfections in a plane mirror measurement object of an interferometry system introduce errors in displacement and angle measurements made using the interferometry system. The effect of these errors may be amplified when determining the location of a mark located away from the interferometer's measurement axis. However, the effect of these errors on off-axis measurements can be reduced or eliminated if the contribution to the measurements by the imperfections is known.

Interferometry systems that utilize two interferometers to monitor a plane mirror measurement object along two parallel measurement axes can be used to map the mirror surface profile along a scan line and to characterize errors due to interferometer imperfections. The mirror surface can be mapped by monitoring the displacement of the mirror surface relative to a reference point on each of the two measurement axes while scanning the mirror in a direction orthogonal to the measurement axes where the mirror is sufficiently close to the interferometers so that effects of imperfections in the interferometer is neglible. Provided the stage on which the mirror is mounted does not rotate with respect the interferometers, or where any stage rotation is independently monitored and accounted for, the difference between the displacement measurements provides a measure of the average slope of the mirror surface between the two measurement axes. Furthermore, integrating the slope over the scan line provides a measure of the departure of the mirror surface from a perfectly planar surface (also referred to as mirror "unevenness").

Because the mirror profile is essentially unchanging, subsequent scans with the stage further from the interferometers or with the stage at a non-zero nominal rotation angle provides information related to interferometer imperfections. In particular, any variation between the measured phases not attributable to mirror imperfections or rotations of the stage can be attributed to imperfections in the interferometers.

However, correcting interferometry measurements for errors due to mirror and interferometer imperfections using the aforementioned error characterization does not necessarily account for contributions that occur with spatial frequencies proportional to $K=2\pi/d$, where d is the separation of the measurement axes. Because variations with these spatial frequencies contribute equally to both displacement measurements, they do not contribute to the difference between the displacement measurements. Furthermore, these variations contribute equally to the sum of the displacement measurements, just as an actual change in the mirror displacement would.

Insensitivity to these variations can be mitigated, at least partially, by transforming error characterization data into a spatial frequency domain, and weighting the contribution of certain frequency components to an error correction term more heavily than other frequency components. In particular, by weighting frequency components close to $K=2\pi/d$ (and its harmonics) more heavily than other components errors due to the insensitivity of the error characterization method can be reduced.

In general, in one aspect, the invention features a method for determining the location of an alignment mark on a stage including measuring a location, $x_1$, of a stage along a first measurement axis using an interferometer, measuring a location, $x_2$, of the stage along a second measurement axis substantially parallel to the first measurement axis, and determining a location of the alignment mark along a third axis substantially parallel to the first measurement axis based on $x_1$, $x_2$, and a correction term, $\psi_3$, calculated from predetermined information including information characterizing imperfections in the interferometer.

Embodiments of the method can include one or more of the following features and/or features of other aspects.

$x_1$ and $x_2$ can correspond to the location of the mirror at the first and second measurement axes, respectively. $x_2$ can be measured using a second interferometer. The predetermined information can include information characterizing imperfections in the second interferometer. The correction term, $\psi_3$, can include a contribution related to an integral transform (e.g., a Fourier transform) of $X_2$ and $X_1$ which correspond to $x_2$ and $x_1$ monitored while scanning the stage in a direction substantially orthogonal to the first and second measurement axes. Contributions to $\psi_3$ from different spatial frequency components of $X_1$ and $X_2$ can be weighted to increase the sensitivity of $\psi_3$ to spatial frequency components near $K_d$ and harmonics of $K_d$, wherein $K_d$ corresponds to the $2\pi/d_1$ where $d_1$ is a separation between the first and second measurement axes. The alignment mark location can be related to a location, $x_3$, on the third axis given by $$x_3 = (1-\gamma)x_1 + \gamma x_2 + d_2\theta - \psi_3,$$

wherein $\gamma$ is related to a position of a measurement axis relative to the first axis, the third axis and the measurement axis are separated by a distance $d_2$, and $\theta$ is related to an orientation angle of the stage with respect to the measurement axis. In some embodiments, the first axis and the second axis are separated by a distance $d_1$ and the first axis and measurement axis are separated by a distance $\gamma d_1$.

The method can include interferometrically monitoring the location of the stage along a y-axis substantially orthogonal to the first measurement axis. The measurement beam reflects from the mirror more than once. In some embodiments, the predetermined information further includes information characterizing surface variations of the mirror. The information characterizing surface variations of the mirror can include information characterizing surface variations of the mirror for different spatial frequencies, wherein contributions to the correction term from different spatial frequencies are weighted differently.

The correction term, $\psi_3$, can include a contribution related to an integral transform of $X_2-X_1$, wherein $X_2$ and $X_1$ correspond to $x_2$ and $x_1$ monitored while scanning the stage in a direction substantially orthogonal to the first and second measurement axes. Alternatively, or additionally, the correction term, $\psi_3$, can include a contribution related to an integral transform of $X_2+X_1$, wherein $X_2$ and $X_1$ correspond to $x_2$ and $x_1$ monitored while scanning the stage in a direction substantially orthogonal to the first and second measurement axes. Imperfections in the interferometer can cause an interferometric phase measured using the interferometer to vary non-periodically and non-linearly as a function of a relative position of the measurement object along the first measurement axis.

In general, in another aspect, the invention features a method including determining a correction term related to imperfections in an interferometry system from measurements of first and second degrees of freedom of a measurement object with the interferometry system and correcting subsequent measurements of a third degree of freedom of the measurement object made using the interferometry system based on the correction term.

Embodiments of the method can include one or more of the following features and/or features of other aspects.

The first and second degrees of freedom can include positions of the measurement object relative to first and second axes of the interferometry system, respectively. The first axis can be substantially parallel to the second axis. The third degree of freedom can include a position of the measurement object relative to a third axis substantially parallel to the first and second axes. The second axis can be located between the first and third axes.

The measurement object can include a plane mirror. The correction term can further include information related to surface variations of the plane mirror. The information related to surface variations of the mirror can include information characterizing surface variations of the mirror for different spatial frequencies, wherein contributions to the correction term from different spatial frequencies are weighted differently.

In some embodiments, the interferometry system includes first and second interferometers which during operation monitor the first and second degrees of freedom, wherein the correction term comprises information related to imperfections in the first and second interferometers. The imperfections can include bulk imperfections and/or surface imperfections.

The imperfections in the interferometry system can include an interferometric phase measured by the interferometry system that varies non-periodically and non-linearly as a function of a relative position of the measurement object along one of the first and second degrees of freedom. Determining the correction term can include weighting contributions to the sum or difference of the monitored degrees of freedom from differently for different spatial frequencies.

In general, in a further aspect, the invention features a method including scanning a mirror surface relative to a pair of substantially parallel measurement axes of an interferometry system for a plurality of scan paths of different relative positions of the mirror surface along the measurement axes, monitoring locations $X_1$ and $X_2$ of the mirror surface relative to the interferometric measurement axes with the interferometry system during the scanning, determining a profile of the mirror surface for each of the scan paths based on the monitored locations, and determining a correction term related to imperfections in the interferometer based on variations between the mirror profiles.

Embodiments of the method can include one or more of the following features and/or features of other aspects.

Determining the mirror profiles can include determining an average slope of the mirror surface from $X_1$ and $X_2$ for a plurality of locations on the mirror surface for each of the scan paths. Determining the mirror profile can further include determining a fit to the average slope of the mirror surface for the plurality of locations. Determining the mirror profile can also include determining variations of the average slope from the fit. Determining the correction term can include performing an integral transform of the average slope of the mirror surface for the plurality of locations on the mirror surface. The integral transform can provide information related to contributions to mirror surface variations from different spatial frequencies, and determining the correction term can include weighting the contribution some spatial frequencies to the correction term differently than the contribution from other spatial frequencies.

Determining the mirror profile for each scan path can include monitoring an orientation of the mirror surface with respect to the measurement axes during the scanning. Determining the mirror profiles can further include compensating the average slope of the mirror surface for the plurality of locations on the mirror surface for variations in the monitored orientation of the mirror surface.

The scan paths can be substantially orthogonal to the measurement axes. The mirror surface can be scanned along one of the scan paths for a plurality of nominal rotation angles with respect to the measurement axes, and a mirror scan profile is determined for each of the nominal rotation angles.

In general, in another aspect, the invention features a method including correcting measurements of a degree of freedom of a mirror relative to a first axis made using a first interferometer based on information that accounts for imperfections in the first interferometer for different spatial frequencies, wherein contributions to the correction from the different spatial frequencies are weighted differently.

Embodiments of the method can include one or more of the following features and/or features of other aspects.

A second interferometer can monitor a degree of freedom of the mirror along a second axis parallel to and offset from the first axis. The information can account for imperfections in the second interferometer. The first interferometer can monitor a degree of freedom of the mirror along a second axis and contributions to the correction from different spatial frequency components by imperfections in the interferometer are weighted to increase the sensitivity of the correction to spatial frequency components near $K_d$ or harmonics of $K_d$, wherein $K_d$ corresponds to the $2\pi/d$ where d is a separation between the second and third axes.

In general, in a further aspect, the invention features an apparatus including an interferometer configured to monitor a location, $x_1$, of a mirror surface along a first axis, and an electronic controller coupled to the interferometer, wherein during operation the electronic controller determines a location of the mirror surface along a third axis based on $x_1$, a location, $x_2$, of the mirror surface along a second axis and a correction term, $\psi_3$, calculated from predetermined information including information characterizing imperfections in the interferometer.

Embodiments of the apparatus can include one or more of the following features and/or features of other aspects.

The apparatus can further include a second interferometer configured to monitor $x_2$. The correction term, $\psi_3$, can be calculated from predetermined information including information characterizing imperfections in the second interferometer. Alternatively, or additionally, the correction term, $\psi_3$, can be calculated from predetermined information including information characterizing imperfections in the mirror surface. The first axis can be substantially parallel to the second measurement axis. The third axis can be substantially parallel to the first axes and the second axis is located between the first and third axes.

In another aspect, the invention features a lithography system for use in fabricating integrated circuits on a wafer, including a stage for supporting the wafer, an illumination system for imaging spatially patterned radiation onto the wafer, a positioning system for adjusting the position of the stage relative to the imaged radiation, and foregoing apparatus for monitoring the position of the wafer relative to the imaged radiation.

In another aspect, the invention features a lithography system for use in fabricating integrated circuits on a wafer including a stage for supporting the wafer, and an illumination system including a radiation source, a mask, a positioning system, a lens assembly, and the foregoing apparatus, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

In a further aspect, the invention features a beam writing system for use in fabricating a lithography mask including a source providing a write beam to pattern a substrate, a stage supporting the substrate, a beam directing assembly for delivering the write beam to the substrate, a positioning system for positioning the stage and beam directing assembly relative one another, and the foregoing apparatus for monitoring the position of the stage relative to the beam directing assembly.

In another aspect, the invention features a lithography method for use in fabricating integrated circuits on a wafer including supporting the wafer on a moveable stage, imaging spatially patterned radiation onto the wafer, adjusting the position of the stage, and monitoring the position of the stage using one the foregoing the methods.

In a further aspect, the invention features a lithography method for use in the fabrication of integrated circuits including directing input radiation through a mask to produce spatially patterned radiation, positioning the mask relative to the input radiation, monitoring the position of the mask relative to the input radiation using one of the foregoing methods, and imaging the spatially patterned radiation onto a wafer.

In another aspect, the invention features a lithography method for fabricating integrated circuits on a wafer including positioning a first component of a lithography system relative to a second component of a lithography system to expose the wafer to spatially patterned radiation and monitoring the position of the first component relative to the second component using one of the foregoing methods.

In a further aspect, the invention features a method for fabricating integrated circuits, the method including one of the foregoing lithography methods or one of the foregoing lithography systems.

In another aspect, the invention features a method for fabricating a lithography mask including directing a write beam to a substrate to pattern the substrate, positioning the substrate relative to the write beam, and monitoring the position of the substrate relative to the write beam using one of the foregoing methods.

Embodiments of the invention may include one or more of the following advantages.

Errors in determining the location of off-axis markers due to imperfections in interferometers and/or a plane mirror measurement object can be reduced, particularly those errors that occur with spatial frequencies~$2\pi/d$, and harmonics thereof. The disclosed methods can also be used to reduce errors in on-axis measurements.

The contribution of interferometer and mirror imperfections to phase measurements can be characterized using an interferometry system used in the application in which the interferometry system is ultimately used. This error characterization can be performed in situ. Mapping can be repeated to account for changes that may occur over the lifetime of the system.

Due to the disclosed error correction methods, the error tolerances of an interferometer and/or other components can be relaxed without compromising measurement accuracy. Accordingly, in some embodiments, the system can use less expensive components (e.g., mirrors) without compromising measurement accuracy.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

One example of an application in which displacement measuring interferometers are used to determine the location of an off-axis marker is for determining the location of alignment marks in a lithography tool (also referred to as a lithography scanner). Alignment marks are reference marks on a wafer and/or stage that are located by an optical alignment scope, often positioned away from the main optical axis of the tool's exposure system.

Figure 1:
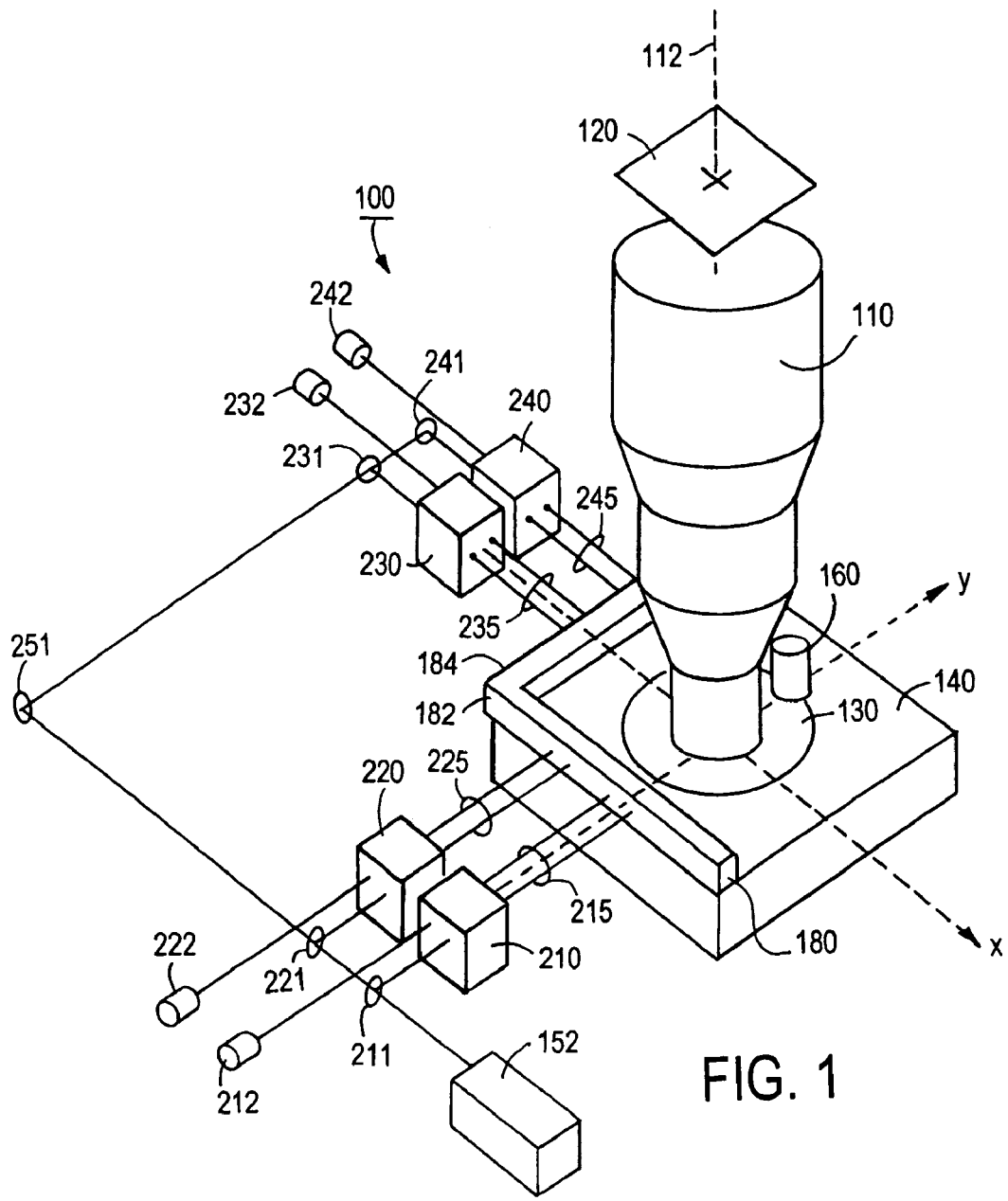
FIG. 1 is a perspective view of an embodiment of a lithography tool.
Figure 2:
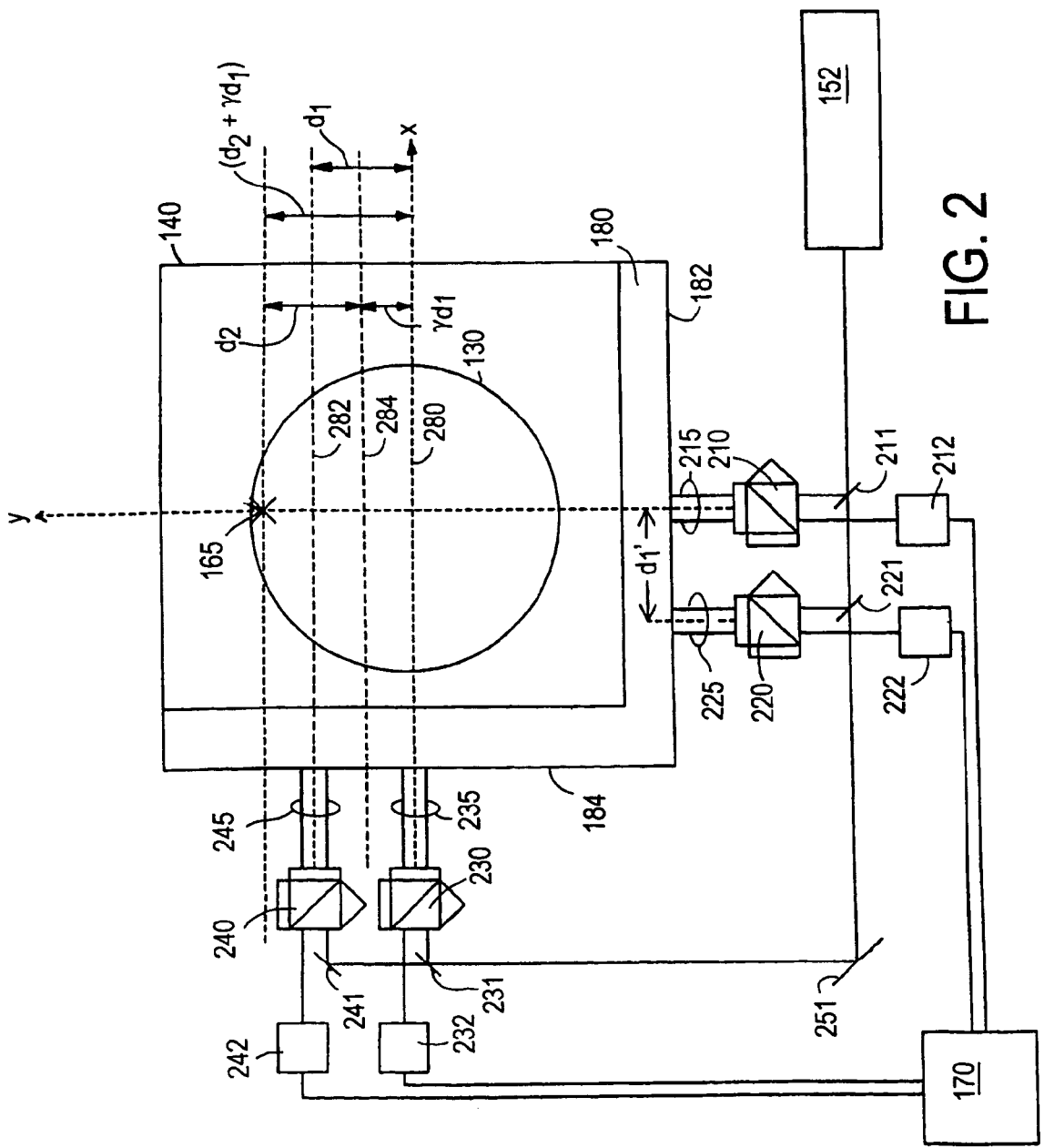
FIG. 2 is a plan view of the stage and interferometry system of the lithography tool shown in FIG. 1.

Referring now to FIG. 1 and FIG. 2, an exemplary lithography tool 100 includes an exposure system 110 positioned to image a reticle 120 onto an exposure region 135 of a wafer 130. Wafer 130 is supported by a stage 140, which scans wafer 130 in a plane orthogonal to an axis 112 of exposure system 110. A stage mirror 180 is mounted on stage 140. Stage mirror 180 includes two nominally orthogonal reflecting surfaces 182 and 184.

An interferometry system monitors the position of stage 140 along orthogonal x- and y-measurement axes. The x- and y-axes intersect with axis 112 of exposure system 110. The interferometry system includes four interferometers 210, 220, 230, and 240. Interferometers 210 and 220 respectively direct measurement beams 215 and 225 parallel to the y-axis to reflect from mirror surface 182. Similarly, interferometers 230 and 240 respectively direct measurement beams 235 and 245 parallel to the x-axis to reflect twice from mirror surface 184. After reflection from the mirror surfaces, each measurement beam is combined with a reference beam to form an output beam. A phase of each output beam is related to the optical path length difference between the measurement and reference beam paths. Detectors 212, 222, 232, and 242 detect the output beams from interferometers 210, 220, 230, and 240, respectively, and communicate optical path length difference information to an electronic controller 170, which determines the stage position from the information and adjusts the position of stage 140 relative to exposure system 110 accordingly.

The input beam for each interferometer is derived from a common source, laser light source 152. Beam splitters 211, 221, 231, and mirrors 241 and 251 direct light from light source 152 to the interferometers. Each interferometer splits its input beam into a measurement beam and a reference beam. In the present embodiment, each interferometer directs its respective measurement beam along a path that contacts a surface of mirror 180 twice.

Interferometers 230 and 210 monitor co-ordinates $x_1$ and $y_1$ of the location of mirror surfaces 184 and 182 along the x- and y-axes, respectively. Additionally, interferometers 240 and 220 monitor the location of stage 140 along a second set of axes, offset from but parallel to the x- and y-axes, respectively. The secondary measurements provide co-ordinates $x_2$ and $y_2$ of mirror surfaces 184 and 182, respectively. The separations of these secondary measurement axes from the x- and y-axes are known, and are indicated as $d_1$ and $d_1'$ in FIG. 2.

Figure 3:
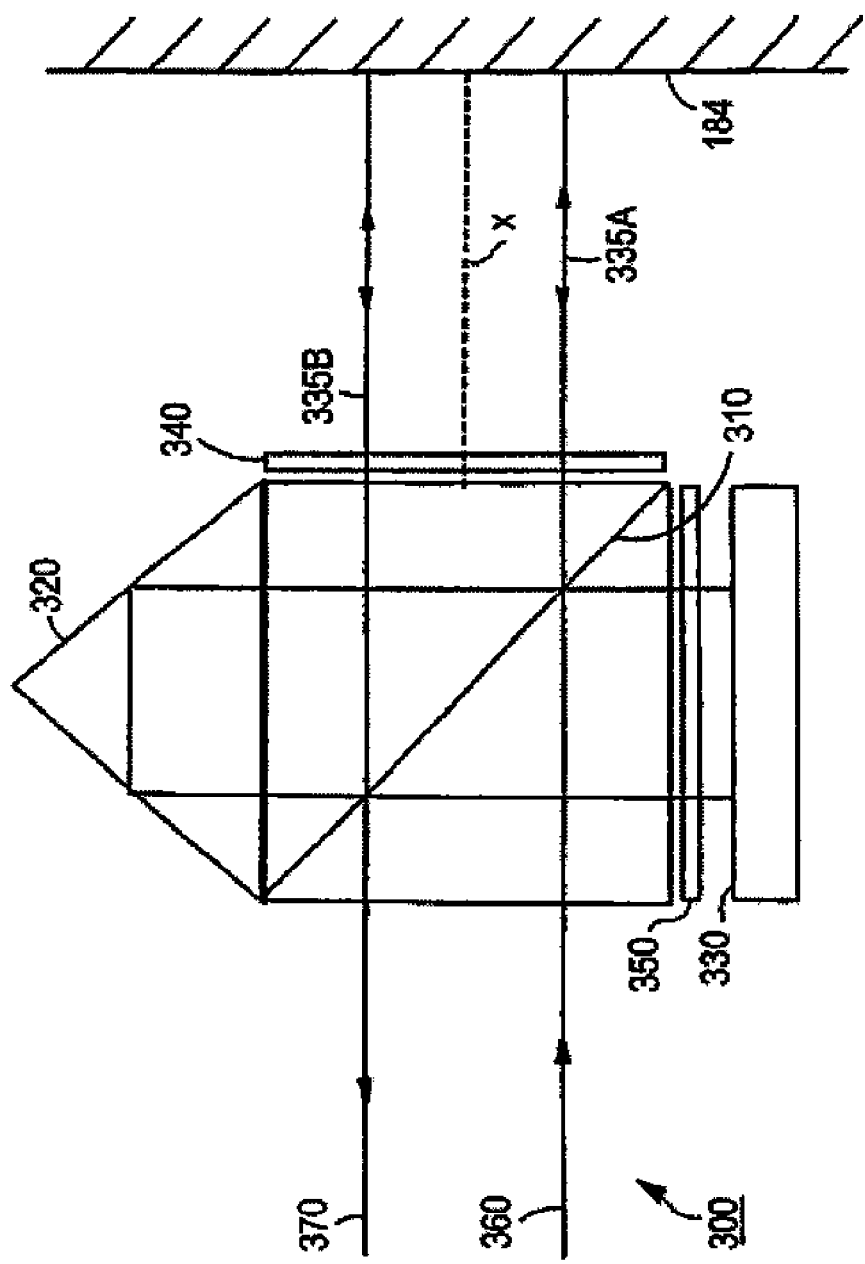
FIG. 3 is a schematic of a high stability plane mirror interferometer.

In some embodiments, interferometers 210, 220, 230, and 240 are high stability plane mirror interferometers (HSPMIs). Referring to FIG. 3, an HSMPI 300 includes a polarizing beam splitter (PBS) 310, a retroreflector 320, and a reference mirror 330. HSPMI 300 also includes quarter wave plates 340 and 350, positioned between PBS 310 and mirror surface 184 or reference mirror 330, respectively.

During operation, PBS 310 splits the input beam, indicated as beam 360 in FIG. 3, into orthogonally polarized components. One component, measurement beam 335A, is transmitted by PBS 310 and reflects from mirror surface 184 back towards PBS 310. On its return to PBS 310, the polarization state of the measurement beam is now orthogonal to its original polarization state due to the passing through quarter wave plate 340 twice, and the measurement beam is reflected by PBS 310 towards retroreflector 320. Retroreflector 320 directs the measurement beam back towards PBS 310, which reflects the measurement beam towards mirror surface 184. On the second pass to mirror surface 184, the measurement beam is indicated as beam 335B. Again, mirror surface 184 reflects beam 335B towards PBS 310. The double pass through quarter wave plate 340 transforms the polarization state of the measurement beam back to its original state, and it is transmitted by PBS 310 and exits HSPMI 300 as a component of an output beam 370.

The reference beam is the component of input beam 360 initially reflected by PBS 310. The reference beam passes between PBS 310 and reference mirror 330 twice. On each pass, quarter wave plate 350 transforms the polarization state of the reference beam by 90°. Thus, after the first pass of the reference beam to reference mirror 330, PBS 310 transmits the reference beam. After the reference beam's second pass to reference mirror 330, PBS 310 reflects the reference beam, which exits the interferometer 300 as a component of output beam 370.

Displacement measuring interferometers other than HSPMI's can also be used in lithography tool 100. For example, interferometers 210 and 220 can be replaced by a multi-axis interferometer. Examples of other displacement measuring interferometers include single beam interferometers and/or high accuracy plane mirror interferometers (in which the measurement beam can pass to the measurement object more than twice, e.g., four times). Additional examples of interferometer configurations are described in U.S. patent application Ser. No. 10/364,300, filed Feb. 11, 2003, and entitled "SEPARATED BEAM MULTIPLE DEGREE OF FREEDOM INTERFEROMETER," which claims priority to U.S. Provisional Patent Applications No. 60/356,394 filed Feb. 12, 2002 and entitled "SEPARATED BEAM MULTIPLE DEGREE OF FREEDOM INTERFEROMETERS" and U.S. patent application Ser. No. 10/351,707, filed Jan. 27, 2003, and entitled "MULTIPLE DEGREE OF FREEDOM INTERFEROMETER," which claims priority to U.S. Provisional Application No. 60/379,987 filed May 13, 2002 and entitled "MULTIPLE DEGREE OF FREEDOM HIGH STABILITY PLANE MIRROR INTERFEROMETER," both of which are by Henry A. Hill, and also described in an article entitled "Differential interferometer arrangements for distance and angle measurements: Principles, advantages and applications" by C. Zanoni, *VDI Berichte* Nr. 749, 93-106 (1989). The contents of the cited U.S. Provisional Patent Applications 60/356,394 and 60/379,987 and the article by Zanoni are incorporated herein in their entirety by reference.

Furthermore, although the foregoing discussion includes a description of heterodyne interferometry, homodyne detection schemes can also be used.

Referring again to FIG. 1 and FIG. 2, interferometers 230 and 240 respectively monitor $x_1$ and $x_2$ along interferometer axes 280 and 282, which are separated by a distance $d_1$. In the present embodiment, exposure system 110 is positioned with axis 112 coincident with axis 280, which corresponds to the x-axis. Accordingly, $x_1$ corresponds to the stage's position along the x-axis. In some embodiments, measurements of $x_1$ and $x_2$ can be used to determine the position stage 140 along a user defined axis between axis 280 and axis 282. For example, in embodiments where the exposure system is positioned with its optical axis midway between interferometer axes 280 and 282, the stage position can be determined along a measurement axis midway between interferometer axes 280 and 282 as $$x' = \frac{1}{2}(x_1 + x_2).$$

More generally, the stage position can be determined on a measurement axis 284 separated from axis 280 by $\gamma d_1$ according to the formula $$x_{1+\gamma} = (1-\gamma)x_1 + \gamma x_2 \quad (1)$$

Lithography tool 100 also includes an alignment scope 160, positioned off-axis from axis 112. Alignment scope 160 is positioned to locate objects at a position on the y-axis, offset from the x-axis (corresponding to axis 280) by an amount $d_2+\gamma d_1$, where $d_2$ is the separation between axis 284 and another axis 286, parallel to the x-axis, on which the alignment scope is located. In the present embodiment, a user locates an alignment mark 165 with alignment scope 160. Because the position of alignment scope 180 with respect to exposure system 110 and the x- and y-axes is known, locating the alignment mark 165 with the scope registers the alignment mark with respect to the exposure system. The values of $x_1$, $x_2$, $y_1$, and $y_2$ that are measured once the user has located alignment mark 165 provide a set of reference co-ordinates indicative of the alignment mark's location on the stage. Based on these reference co-ordinates, the user can accurately translate the wafer on the stage with respect to the exposure system to locate target regions of the wafer on axis 112.

Figure 4:
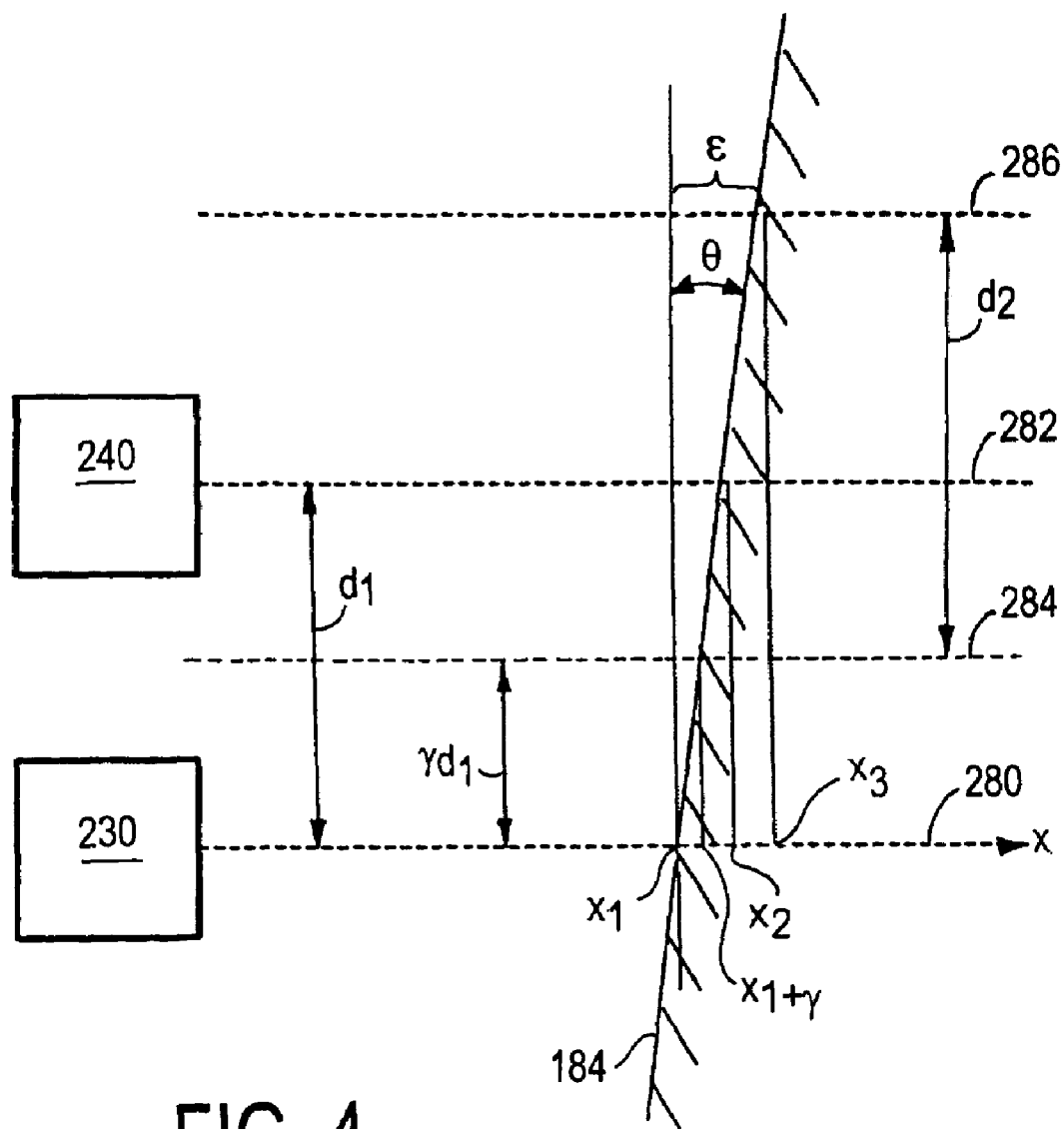
FIG. 4 is a schematic showing an Abbe offset error.

Any repositioning of the stage based on the reference co-ordinates should account for the angular orientation of the stage when alignment mark 165 is located by alignment scope 160. The effect of stage orientation is illustrated in FIG. 4, which shows axes 282 and 284, measurement axis 284, and axis 286. The location of the mirror along axis 286 is denoted as $x_3$. Where the orientation angle, θ, of the stage is zero, $x_1=x_2=x_3$. However, for non-zero θ, $x_3-x_1=\eta d \tan θ \equiv \epsilon$. The offset, $\epsilon$, is referred to as the Abbe offset error.

For a perfectly flat mirror, imperfection free interferometers, and for small θ, $$\tilde{\theta} = \frac{x_2 - x_1}{d}, \quad (2)$$

however, as discussed previously, imperfections in the mirror surface (e.g., surface unevenness and/or local slope variations) and/or imperfections in one or both of the interferometers introduce errors into the interferometrically observed values of $x_1$ and $x_2$.

Interferometer errors, also referred to as non-cyclic non-linear errors, can arise due to wavefront distortions in the measurement and/or reference beams and due to beam shear between the components of the output beam at the detector. Wavefront distortions arise, for example, from imperfections in components of the interferometer, including surface imperfections (e.g., scratches, dust or other foreign particles on a surface, or surface inhomogeneities) and bulk imperfections (e.g., bulk inhomogeneities or cracks). Scattering from such imperfections can distort a beam's wavefront profile from a nominal form (e.g., from a plane wave) and can affect a measured phase when interfered with another beam. Where the distortion of one wavefront relative to the interferometer varies as a function of mirror displacement, the distortion can result in errors in a monitored interference phase.

Beam shearing refers to a displacement of the component beams in the output beam relative to each other (i.e., differential mode beam shear) or a displacement of the output beam relative to a nominal output beam path (i.e., common mode beam shear). Beam shears can be caused for example by a change in direction of propagation of the input beam to an interferometer or a change in orientation of the object mirror in a double pass plane mirror interferometer such as a high stability plane mirror interferometer (HSPMI). Such a directional change causes the path of the measurement beam through the interferometer to vary as a function of mirror displacement. Accordingly, a wavefront distortion in the measurement beam will vary relative to the reference beam resulting in a varying contribution to the detected phase, in turn resulting in errors in the measured interference phase. Hence, wavefront distortions in combination with beam shear can cause phase errors and reduce the accuracy of interferometric measurements.

Due to these imperfections, interferometers 230 and 240 measure $\tilde{x}_1$ and $\tilde{x}_2$, respectively, wherein the tilde indicates an observable parameter, and observables $\tilde{x}_1$ and $\tilde{x}_2$ are related to the physical displacements $x_1$ and $x_2$ by $\tilde{x}_1 = x_1 + \psi_1$ and $\tilde{x}_2 = x_2 + \psi_2$, where $\psi_1$ and $\psi_2$ represent deviations of the measured values from those the physical displacements $x_1$ and $x_2$. Substituting $\tilde{x}_1$ and $\tilde{x}_2$ for $x_1$ and $x_2$ in Eq. (2), yields $$\tilde{\theta} = \frac{(\tilde{x}_2 - \tilde{x}_1)}{d_1} = \frac{(x_2 - x_1)}{d_1} + \frac{(\psi_2 - \psi_1)}{d_1}. \quad (3)$$

Accordingly, for small $\tilde{\theta}$, the Abbe offset error becomes $$\varepsilon = \eta d \left[ \frac{\tilde{x}_2 - \tilde{x}_1}{d} - \frac{\psi_2 - \psi_1}{d} \right], \quad (4)$$

and $x_3$ can be determined from $$\begin{aligned} x_3 &= x_{1+\gamma} + d_2 \tilde{\theta} - \psi_3 \\ &= (1-\gamma)\tilde{x}_1 + \gamma \tilde{x}_2 + d_2 \tilde{\theta} - \psi_3, \end{aligned} \quad (5)$$

where $\psi_3$ is an error correction term accounting for imperfections in the surface of the mirror and in the interferometers.

$\psi_3$ can be represented by $$\psi_3 = \eta_1[(\psi_2-\psi_1)_M + (\psi_2-\psi_1)_I] + \gamma[(\psi_2-\psi_1)_M + (\psi_2-\psi_1)_I] - [(\psi_1)_M + (\psi_1)_I] \quad (6)$$

where $\gamma$ is selected according to an end use application, the subscript M denotes the contribution to $\psi_3$ from the mirror, and the subscript I denotes the contribution to $\psi_3$ from the interferometers. Accordingly, the formula for $x_3$ may be rewritten as $$x_3 = \tilde{x}_1 + \gamma(\tilde{x}_2 - \tilde{x}_1) + d_2\tilde{\theta} - \\ \left(\eta_1 + \gamma - \frac{1}{2}\right)[(\psi_2-\psi_1)_M + (\psi_2-\psi_1)_I] - \\ \frac{1}{2}[(\psi_2+\psi_1)_M + (\psi_2+\psi_1)_I]. \quad (7)$$

In Eq. (6) and Eq. (7), $\psi_3$ is written in terms of differential mode (i.e., $(\psi_2-\psi_1)$) and common mode (i.e., $(\psi_2+\psi_1)$) components of the errors in order to more easily establish correspondence with available measured quantities. Note that according to Eq. (7), the differential mode components $(\psi_2-\psi_1)$ are amplified by the factor $(\eta_1+\gamma-1/2)$ and that the common mode components enter only as an average with no amplification. Further note the selection of $\gamma$ affects the magnitudes of the differential mode component of error term in $x_3$, but not the common mode components.

$\psi_3$ can be determined by characterizing components of the interferometers and the mirror prior to their installation in lithography tool 100. Alternatively, $\psi_3$ can be determined in situ (i.e., once installed within lithography tool 100).

Methods for characterizing interferometer errors and interferometer component errors prior to installation (or once installed, but using a separate characterization apparatus) are described, for example, in U.S. patent application Ser. No. 10/366,587, filed Feb. 12, 2003, and entitled "CHARACTERIZATION AND COMPENSATION OF NON-CYCLIC ERRORS IN INTERFEROMETRY SYSTEMS," by Henry A. Hill, the entire contents of which are hereby incorporated by reference.

Methods for characterizing mirrors include, for example, those disclosed in U.S. patent application Ser. No. 09/853,114, filed May 10, 2001 entitled "IN-SITU MIRROR CHARACTERIZATION", by Henry Allen Hill, the entire contents of which are hereby incorporated by reference.

Alternatively, or additionally, $\psi_3$ can be determined in situ by running an error characterization procedure, also referred to as the error characterization mode. In the error characterization mode, stage 140 is translated in the y-direction while keeping the x-position of the stage constant and while monitoring $\tilde{x}_1$ and $\tilde{x}_2$. Scans are repeated for a number of nominal positions of the stage along the x-axis and for a number of nominal stage orientation angles. During each scan, measurement beams 235 and 245 of interferometers 230 and 240, respectively, scan mirror surface 184 along a datum line and generate signals containing information indicative of the mirror surface angular orientation and apparent surface departure (i.e., surface unevenness) in the x-y plane from a nominal plane, along with any contributions due to variations in the translation mechanism for moving stage 140 and other sources of error (e.g., cyclic non-linearities, and stationary and non-stationary effects of a gas in measurement paths of beams of interferometers 230 and 240). The scan produces $\tilde{X}_1(y,x,\theta)$ and $\tilde{X}_2(y,x,\theta)$, corresponding to displacement measurements from interferometers 230 and 240 respectively.

Simultaneous with translation of stage 140 in the y-direction, interferometers 210 and 220 monitor the orientation of mirror surface 182 for fixed intercept points of measurement beams 215 and 225 with surface 182. This step permits monitoring changes in $\theta$, due to, for example, the rotation of stage 140 due to mechanical contributions of its translation mechanism, such as bearings, drive mechanisms, and the like. Measurement of the angular orientation of mirror surface 182 provides a redundant measure of the angular orientation, $\tilde{\theta}(y)$, of stage 140 during the scan, which can be used to remove the contribution of angular rotations of stage 140 from the $\tilde{X}_1(y,x,\theta)$ and $\tilde{X}_2(y,x,\theta)$ data.

Initially, the stage is scanned for the x-position closest to interferometers 230 and 240, $x_{min}$, and for $\theta$ nominally equal to zero (hereinafter $\theta_0$). Beam shears are typically reduced when the displacement of the mirror from the interferometers is smallest, so the contribution of errors due to beam shear for this scan can be ignored. Accordingly, once corrected for any angular rotations of stage 140 that occurred during the scan, $\tilde{X}_1(y,x_{min},\theta_0)$ and $\tilde{X}_2(y,x_{min},\theta_0)$ provide a measure of the local slope of mirror surface 184 along the datum line. Where there is no contribution from stage rotations, the local slope, $\langle dx/dy\rangle_{Map}$, is given by $$\langle dx/dy\rangle_{Map}(y) = \frac{\tilde{X}_2(y) - \tilde{X}_1(y)}{d}, \tag{8}$$

where the subscript Map refers to data acquired during the error characterization mode. Parameterization of $\tilde{X}_1$, $\tilde{X}_2$, and $\langle dx/dy\rangle_{Map}$ as functions of x and $\theta$ is implied, though not shown explicitly. A linear fit to the $\langle dx/dy\rangle_{Map}$ data yields $\langle dx/dy\rangle_{fit}$, which provides a nominal reference surface.

Deviations of the measured position of the mirror surface from a nominal position of the mirror surface calculated from $\langle dx/dy\rangle_{fit}$ are attributed to mirror imperfections. The relationship between $\psi_{3,M}$, the contribution of mirror imperfections to $\psi_3$, and $\tilde{X}_1$ is given by $$\psi_{3,M} = (\tilde{X}_1 - y\langle dx/dy\rangle_{fit})|_{x=x_{min}, \theta=\theta_0} \tag{9}$$

As the mirror profile is essentially invariant for each scan, this information can be used to extract the contribution of interferometer errors from $\psi_3$ for subsequent error characterization mode scans (i.e., for different nominal x values and different nominal $\theta$ values). Similar mirror error characterization procedures are described in U.S. patent application Ser. No. 10/406,749, filed Apr. 3, 2003, and entitled "METHOD AND APPARATUS FOR STAGE MIRROR MAPPING," and U.S. patent application Ser. No. 10/630,361, filed Jul. 29, 2003, and entitled "COMPENSATION FOR ERRORS IN OFF-AXIS INTERFEROMETRIC MEASUREMENTS," both by Henry A. Hill, the entire contents both of which are hereby incorporated herein by reference.

Subsequent error characterization mode scans provide similar data. However, contributions to $\psi_3$ from imperfections in the interferometers are expected to increase for increasing nominal x values and nominal $\theta$ values. In the absence of mirror and interferometer imperfections, and stage rotations, $\tilde{X}_2 - \tilde{X}_1$ and $\tilde{X}_2 + \tilde{X}_1$ should remain constant for each scan. Thus, once contributions attributable to changes in $\theta$ monitored using interferometers 210 and 220 and to mirror imperfections, residual variations in $\tilde{X}_2 - \tilde{X}_1$ and $\tilde{X}_2 + \tilde{X}_1$ during each subsequent scan are attributed to interferometer imperfections. In other words, a "mirror profile" can be determined for each scan as described for the initial scan and variations between the mirror profile determined from the initial scan and mirror profiles determined from subsequent scans are attributed to the interferometers.

Variations between the mirror profiles are parameterized as functions of y, x, and $\theta$. The variations may be stored in a lookup table in controller 170 and used to compensate measurements during operation of lithography tool 100. The error terms may be represented functionally. For example, the error terms may be represented by a multidimensional power series in x, y, and $\theta$, or in a series of orthogonal functions and coefficients of the representations stored in the lookup tables.

In some embodiments, information obtained during the error characterization mode may be "spatially filtered" to obtain the requisite information about the differential mode components of $\psi_3$. Spatial filtering involves transforming scan data using an integral transform (e.g., a Fourier transform) to devolve the scan information into different spatial frequency components. The error correction term is obtained by integrating, or summing, the contribution from different spatial frequency components. Different spatial frequency components can be weighted differently to reduce the contribution (i.e., remove the contribution) from those components that reduce the accuracy of the error correction term and/or to increase the sensitivity of the correction term to certain spatial frequency components.

An example of a filtering algorithm based on integral transforms is derived in the following series of equations.

$$F\{(\psi_2 - \psi_1)_M\} = \frac{1}{\sqrt{2\pi}} \frac{1}{d_1}\left[\int \tilde{X}_{1,M}(y+d_1)e^{iKy}dy - \int \tilde{X}_{1,M}(y)e^{iKy}dy\right] \tag{10}$$

$$= \frac{1}{\sqrt{2\pi}} \frac{1}{d_1}\int \tilde{X}_{1,M}(y')e^{iK(y'-d_1)}dy' -$$

$$\frac{1}{\sqrt{2\pi}} \frac{1}{d_1}\int \tilde{X}_{1,M}(y)e^{iKy}dy$$

$$= \frac{1}{\sqrt{2\pi}} \frac{1}{d_1}\left[e^{-iKd_1} - 1\right]\int \tilde{X}_{1,M}(y)e^{iKy}dy$$

$$= -ie^{-iKd_1/2}\left(\frac{2}{d_1}\right)\sin\left(\frac{Kd_1}{2}\right)F\{\tilde{X}_{1,M}(y)\},$$

-continued $$F\{(\psi_2 - \psi_1)_I\} = \frac{1}{\sqrt{2\pi}} \frac{1}{d_1} \left[ \int \tilde{X}_{1,I}(y+d_1) e^{iKy} dy - \int \tilde{X}_{1,I}(y) e^{iKy} dy \right] \quad (11)$$

$$= \frac{1}{\sqrt{2\pi}} \frac{1}{d_1} \int \tilde{X}_{1,I}(y') e^{iK(y'-d_1)} dy' -$$

$$\frac{1}{\sqrt{2\pi}} \frac{1}{d_1} \int \tilde{X}_{1,I}(y) e^{iKy} dy$$

$$= \frac{1}{\sqrt{2\pi}} \frac{1}{d_1} \left[ e^{-iKd_1} - 1 \right] \int \tilde{X}_{1,I}(y) e^{iKy} dy$$

$$= -i e^{-iKd_1/2} \left( \frac{2}{d_1} \right) \sin\left( \frac{Kd_1}{2} \right) F\{\tilde{X}_{1,I}(y)\},$$

where F $\{X\}$ is the Fourier transform of X, $X_{1,M}(y)$ is the position of a nodal line in surface 184 obtained during the initial scan of the error characterization procedure and $X_{1,I}(y)$ is the position of a nodal line in surface 184 obtained during subsequent scans of the error characterization procedure. Thus, $(\psi_2-\psi_1)_M$ and $(\psi_2-\psi_1)_I$ can be obtained from the inverse Fourier transforms of Eq. (11) and Eq. (12), respectively. Also, these derivations use the substitution $$X_2(y) = X_1(y+d_1) \quad (13)$$

The common mode components, $(\psi_2+\psi_1)_M$ and $(\psi_2+\psi_1)_I$ can be obtained from a similar set of spatial filtering algorithms based on integral transforms are derived in the following series of equations.

$$F\{(\psi_2 + \psi_1)_M\} = \frac{1}{\sqrt{2\pi}} \frac{1}{d_1} \left[ \int \tilde{X}_{1,M}(y+d_1) e^{iKy} dy + \int \tilde{X}_{1,M}(y) e^{iKy} dy \right] \quad (14)$$

$$= \frac{1}{\sqrt{2\pi}} \frac{1}{d_1} \int \tilde{X}_{1,M}(y') e^{iK(y'-d_1)} dy' +$$

$$\frac{1}{\sqrt{2\pi}} \frac{1}{d_1} \int \tilde{X}_{1,M}(y) e^{iKy} dy$$

$$= \frac{1}{\sqrt{2\pi}} \frac{1}{d_1} \left[ e^{-iKd_1} + 1 \right] \int \tilde{X}_{1,M}(y) e^{iKy} dy$$

$$= e^{-iKd_1/2} \left( \frac{2}{d_1} \right) \cos\left( \frac{Kd_1}{2} \right) F\{\tilde{X}_{1,M}(y)\},$$

$$F\{(\psi_2 + \psi_1)_I\} = \frac{1}{\sqrt{2\pi}} \frac{1}{d_1} \left[ \int \tilde{X}_{1,I}(y+d_1) e^{iKy} dy + \int \tilde{X}_{1,I}(y) e^{iKy} dy \right] \quad (15)$$

$$= \frac{1}{\sqrt{2\pi}} \frac{1}{d_1} \int \tilde{X}_{1,I}(y') e^{iK(y'-d_1)} dy' +$$

$$\frac{1}{\sqrt{2\pi}} \frac{1}{d_1} \int \tilde{X}_{1,I}(y) e^{iKy} dy$$

$$= \frac{1}{\sqrt{2\pi}} \frac{1}{d_1} \left[ e^{-iKd_1} + 1 \right] \int \tilde{X}_{1,I}(y) e^{iKy} dy$$

$$= e^{-iKd_1/2} \left( \frac{2}{d_1} \right) \cos\left( \frac{Kd_1}{2} \right) F\{\tilde{X}_{1,I}(y)\}.$$

However, the Fourier transform diverges for certain spatial frequencies and errors that occur at those frequencies cannot be obtained from Eq.'s (11), (12), (14), and (15). For example, for $$F\{X_1(y)\} = i \frac{d_1}{2} \left[ \frac{\exp\left(i \frac{Kd_1}{2}\right)}{\sin\left(\frac{Kd_1}{2}\right)} \right] F\{\langle dx/dy \rangle_{Map}\} \quad (16)$$

there are singularities when $$Kd_1/2 = 0, \pi, 2\pi, \quad (17)$$

Accordingly, if information about F $\{X_1(y)\}$ is to be determined using Eq. (16), a multiplicative weighting function should be introduced when integrating the contribution of different frequency components to the error terms given by Eq.'s (11), (12), (14), and (15) to limit the effect of the singularities. The design of the multiplicative weighting function can be based on considerations of the signal-to-noise ratios as a function of spatial frequency. One example of a multiplicative weighting function is $$f(K) = \begin{cases} 0 & \text{for } \frac{2\pi m}{d} - \delta K < K < \frac{2\pi m}{d} + \delta K, \\ 1 & \text{otherwise} \end{cases} \quad (18)$$

where m is an integer and $$\delta K << \frac{2\pi}{d}.$$

Other multiplicative weighting functions can also be used.

Although the transform in Eq. (16) includes a weighing function $\sin^{-1}(Kd/2)$, in other embodiments other weighting functions may be used. Generally, the weighting function should increase sensitivity to those components of the mirror surface profile to which the mirror characterization method is least sensitive. Examples of weighting functions include linear, geometric, and exponential functions of K.

In some embodiments, information about the mirror and/or the interferometers obtained during the error characterization mode can be used to correct for on-axis measurements as well. Furthermore, mirror surface 182 and/or interferometers 210 and 220 can also be characterized using a similar error characterization mode and this information can be used to reduce errors in both on and/or off-axis measurements along the y-axis.

In some embodiments, the off-axis measurement is corrected for errors prior to the off-axis position information being sent to a control system that controls the orientation of stage 140, thereby preventing transferal of these errors to the position of the stage.

In addition, in some embodiments, additional errors introduced by various components in the interferometry system can be reduced using other methods. For example, the effect of cyclic non-linear errors can be reduced by techniques such as described in commonly owned U.S. patent application Ser. No. 10/097,365, entitled "CYCLIC ERROR REDUCTION IN AVERAGE INTERFEROMETRIC MEASUREMENTS," and U.S. patent application Ser. No.

10/616,504, filed Jul. 8, 2003, and entitled "CYCLIC ERROR COMPENSATION IN INTERFEROMETRY SYSTEMS," which claims priority to U.S. Provisional Application No. 60/394,418, filed Jul. 8, 2002 and entitled "ELECTRONIC CYCLIC ERROR COMPENSATION FOR LOW SLEW RATES," all of which are by Henry A. Hill, the contents of which are incorporated herein in their entirety by reference.

An example of another cyclic error compensation technique is described in U.S. patent application Ser. No. 10/287, 898, filed Nov. 5, 2002 and entitled "INTERFEROMETRIC CYCLIC ERROR COMPENSATION," which claims priority to U.S. Provisional Application No. 60/337,478, filed Nov. 5, 2001 and entitled "CYCLIC ERROR COMPENSATION AND RESOLUTION ENHANCEMENT," by Henry A. Hill, the contents of which are incorporated herein in their entirety by reference.

Another example of a cyclic error compensation technique is described in U.S. patent application Ser. No. 10/174, 149, filed Jun. 17, 2002, and entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," which claims priority to U.S. Provisional Patent Application 60/303,299, filed Jul. 6, 2001, and entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," both by Henry A. Hill and Peter de Groot, the contents both of which are incorporated herein in their entirety by reference.

A further example of a cyclic error compensation technique is described in U.S. patent application Ser. No. 60/314, 490, filed Aug. 23, 2001 and entitled "TILTED INTERFEROMETER," by Henry A. Hill, the contents of which is herein incorporated in their entirety by reference.

Other techniques for cyclic error compensation include those described in U.S. patent application Ser. No. 6,137,574 entitled "SYSTEMS AND METHODS FOR CHARACTERIZING AND CORRECTING CYCLIC ERRORS IN DISTANCE MEASURING AND DISPERSION INTERFEROMETRY;" U.S. Pat. No. 6,252,668 B1, entitled "SYSTEMS AND METHODS FOR QUANTIFYING NON-LINEARITIES IN INTERFEROMETRY SYSTEMS;" and U.S. Pat. No. 6,246,481, entitled "SYSTEMS AND METHODS FOR QUANTIFYING NONLINEARITIES IN INTERFEROMETRY SYSTEMS," wherein all three are by Henry A. Hill, the contents of the three above-cited patents and patent applications are herein incorporated in their entirety by reference.

Effects of stationary and non-stationary changes of a gas in measurement paths of the interferometers may be compensated for those end use applications where required. Examples of techniques for compensation of the stationary and non-stationary effects are described in U.S. patent application Ser. No. 10/294,158, filed on Nov. 14, 2002, and entitled "COMPENSATING FOR EFFECTS OF VARIATIONS IN GAS REFRACTIVITY IN INTERFEROMETERS," which claims priority to U.S. Provisional Patent Application No. 60/335,963 filed Nov. 15, 2001 and entitled "COMPENSATION FOR EFFECTS OF STATIONARY NON-RANDOM CHANGES AND STATIONARY RANDOM FLUCTUATIONS IN REFRACTIVITY OF GAS IN INTERFEROMETERS," and U.S. patent application Ser. No. 10/350,522, filed on Jan. 24, 2003, and entitled "METHOD AND APPARATUS FOR COMPENSATION OF TIME-VARYING OPTICAL PROPERTIES OF GAS IN INTERFEROMETERY," which claims priority to U.S. Provisional Patent Application No. 60/352,061 filed Jan. 24, 2002 and entitled "NON-DISPERSIVE METHOD AND APPARATUS FOR COMPENSATION OF TURBULENCE EFFECTS OF GAS IN INTERFEROMETRY," wherein both are by Henry A. Hill, the contents of both cited applications are incorporated herein in their entirety by reference.

Lithography tools, such as tool 100, are especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p.82 (1997).

Overlay depends directly on the performance, i.e., accuracy and precision, of the distance measuring interferometers used to position the wafer and reticle (or mask) stages. Since a lithography tool may produce $50-100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

As discussed previously, to properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 5:
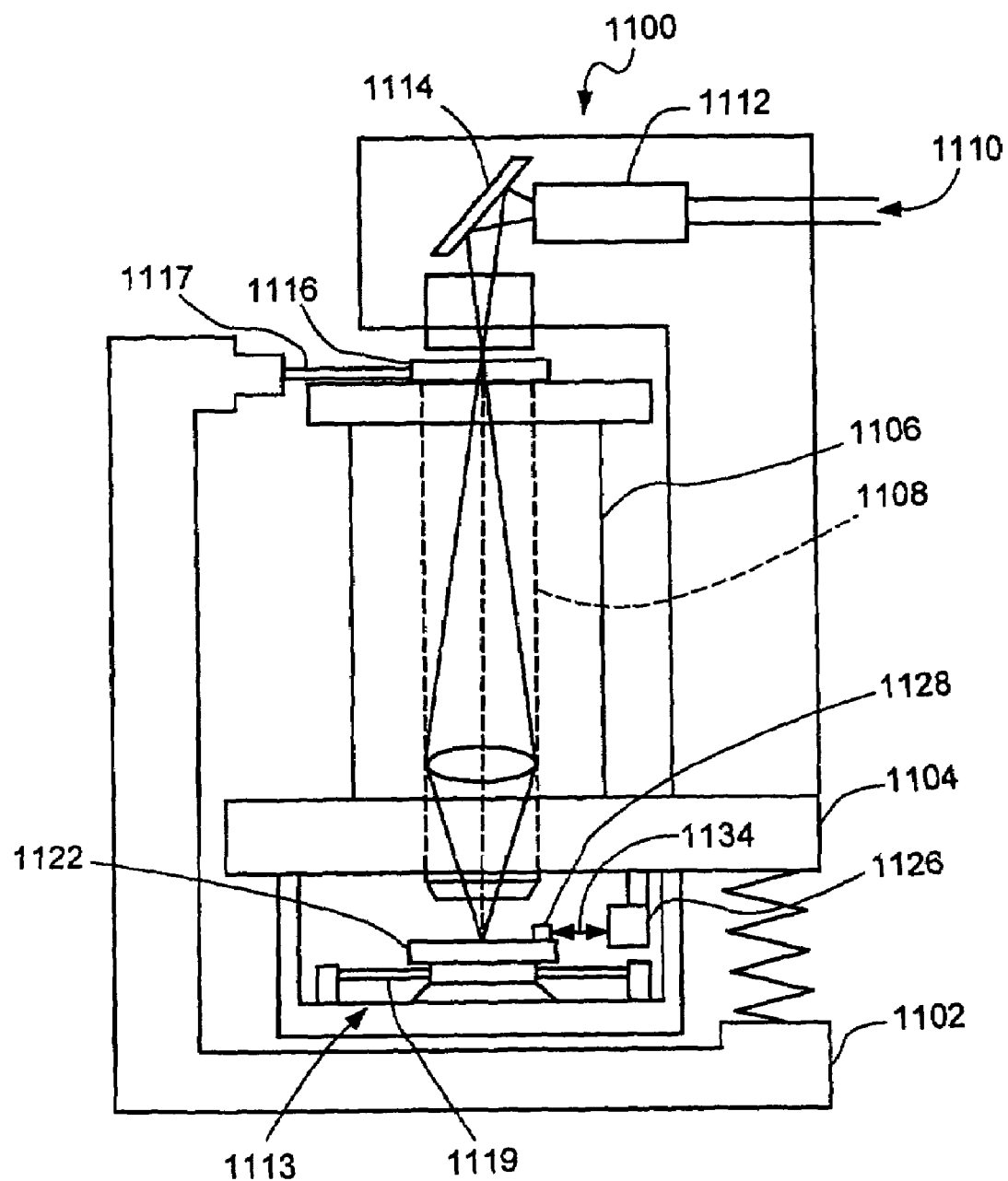
FIG. 5 is a schematic diagram of an embodiment of a lithography tool that includes an interferometer.

Another example of a lithography tool 1100 using an interferometry system 1126 is shown in FIG. 5. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 6A:
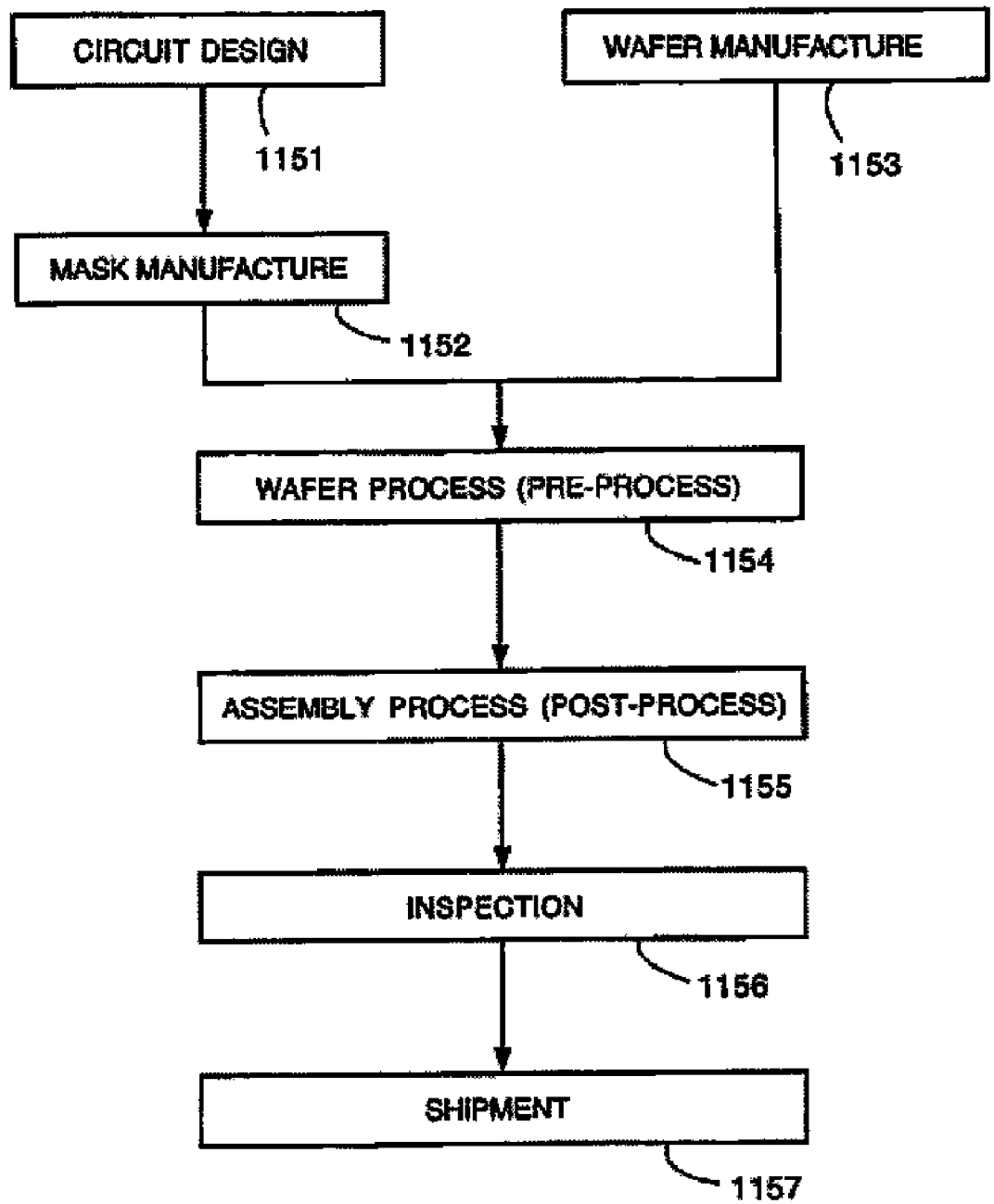
FIG. 6(a) and FIG. 6(b) are flow charts that describe steps for making integrated circuits.
Figure 6B:
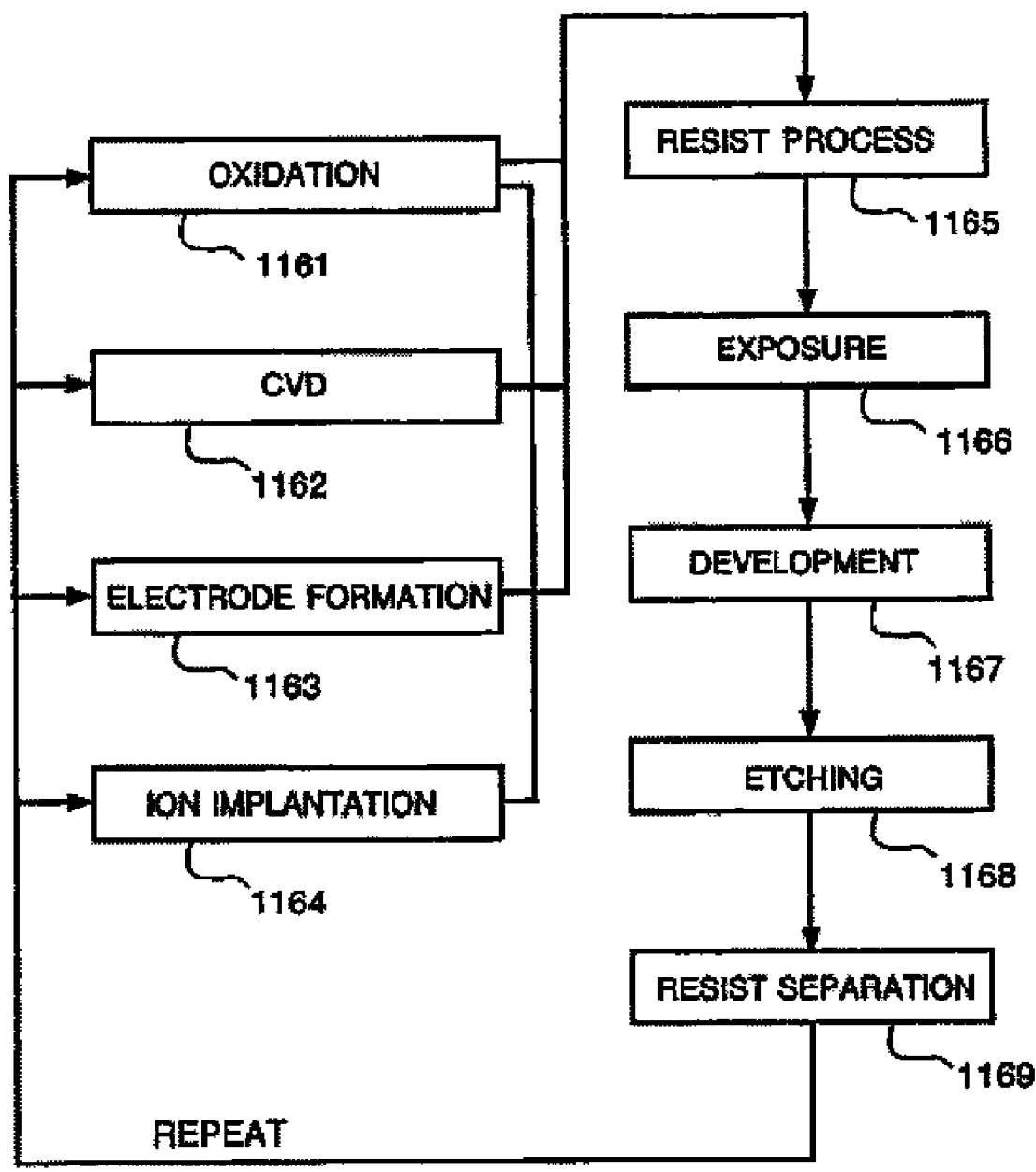

As is well known in the art, lithography is a critical part of manufacturing methods for making semiconducting devices. For example, U.S. Pat. No. 5,483,343 outlines steps for such manufacturing methods. These steps are described below with reference to FIGS. 6(a) and 6(b). FIG. 6(a) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

FIG. 6(*b*) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 7:
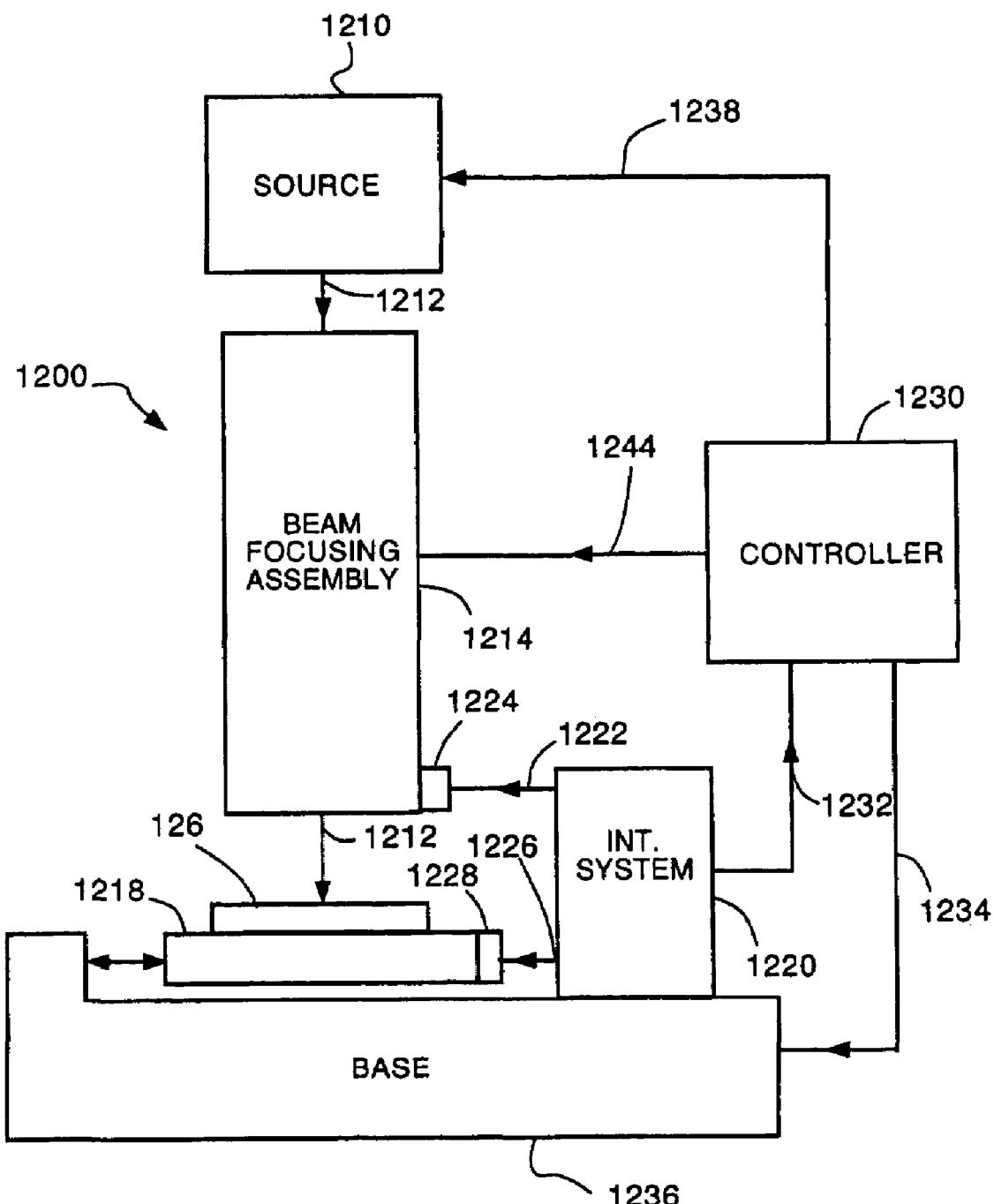
FIG. 7 is a schematic of a beam writing system that includes an interferometry system.

As an example, a schematic of a beam writing system 1200 is shown in FIG. 7. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method for determining the location of an alignment mark on a stage, the method comprising:
    measuring a location, $x_1$, of a stage along a first measurement axis using an interferometer;
    measuring a location, $x_2$, of the stage along a second measurement axis substantially parallel to the first measurement axis; and
    determining a location of the alignment mark along a third axis substantially parallel to the first measurement axis based on $x_1$, $x_2$, and a correction term, $\psi_3$,
    wherein the interferometer comprises interferometer optics configured to direct a measurement beam to reflect from a mirror where the interferometer optics or the mirror are attached to the stage, and $\psi_3$ is calculated from predetermined information comprising information characterizing imperfections in the interferometer optics.

2. The method of claim 1, wherein $x_1$ and $x_2$ correspond to the location of the mirror at the first and second measurement axes, respectively.

3. The method of claim 1, wherein $x_2$ is measured using a second interferometer comprising interferometer optics.

4. The method of claim 3, wherein the predetermined information comprises information characterizing imperfections in the second interferometer.

5. The method of claim 1, wherein the correction term, $\psi_3$, comprises a contribution related to an integral transform of $X_2$ and $X_1$ which correspond to $x_2$ and $x_1$ monitored while scanning the stage in a direction substantially orthogonal to the first and second measurement axes.

6. The method of claim 5, wherein the integral transform is a Fourier transform.

7. The method of claim 5, wherein contributions to $\psi_3$ from different spatial frequency components of $X_1$ and $X_2$ are weighted to increase the sensitivity of $\psi_3$ to spatial frequency components near $K_d$ and harmonics of $K_d$, wherein $K_d$ corresponds to the $2\pi/d_1$ where $d_1$ is a separation between the first and second measurement axes.

8. The method of claim 1, wherein the alignment mark location is related to a location, $x_3$, on the third axis given by $$x_3 = (1-\gamma)x_1 + \gamma x_2 + d_2\theta - \psi_3,$$

wherein γ is related to a position of a measurement axis relative to the first axis, the third axis and the measurement axis are separated by a distance $d_2$, and θ is related to an orientation angle of the stage with respect to the measurement axis.

9. The method of claim 8, wherein the first axis and the second axis are separated by a distance $d_1$ and the first axis and measurement axis are separated by a distance $\gamma d_1$.

10. The method of claim 1, further comprising interferometrically monitoring the location of the stage along a y-axis substantially orthogonal to the first measurement axis.

11. The method of claim 1, wherein the measurement beam reflects from the mirror more than once.

12. The method of claim 1, wherein the predetermined information further comprises information characterizing surface variations of the mirror.

13. The method of claim 12, wherein the information characterizing surface variations of the mirror comprises information characterizing surface variations of the mirror for different spatial frequencies, wherein contributions to the correction term from different spatial frequencies are weighted differently.

14. The method of claim 1, wherein the correction term, $\psi_3$, comprises a contribution related to an integral transform of $X_2 - X_1$, wherein $X_2$ and $X_1$ correspond to $x_2$ and $x_1$ monitored while scanning the stage in a direction substantially orthogonal to the first and second measurement axes.

15. The method of claim 1, wherein the correction term, $\psi_3$, comprises a contribution related to an integral transform of $X_2 + X_1$, wherein $X_2$ and $X_1$ correspond to $x_2$ and $x_1$ scanning the stage in a direction substantially orthogonal to the first and second measurement axes.

16. The method of claim 1, wherein the imperfections in the interferometer cause an interferometric phase measured using the interferometer to vary non-periodically and non-linearly as a function of a relative position of the measurement object along the first measurement axis.

17. A method, comprising:
    determining a correction term related to imperfections in an interferometer optics of a first interferometer in an interferometry system from measurements of first and second degrees of freedom of a measurement object with the interferometry system, where the interferometer optics are configured to direct a beam to reflect from the measurment object; and
    correcting subsequent measurements of a third degree of freedom of the measurement object made using the interferometry system based on the correction term.

18. The method of claim 17, wherein the first and second degrees of freedom comprise positions of the measurement object relative to first and second axes of the interferometry system, respectively.

19. The method of claim 18, wherein the first axis is substantially parallel to the second axis.

20. The method of claim 19, wherein the third degree of freedom comprises a position of the measurement object relative to a third axis substantially parallel to the first and second axes.

21. The method of claim 20, wherein the second axis is located between the first and third axes.

22. The method of claim 17, wherein the measurement object comprises a plane mirror.

23. The method of claim 22, wherein the correction term further comprises information related to surface variations of the plane mirror.

24. The method of claim 23, wherein the information related to surface variations of the mirror comprises information characterizing surface variations of the mirror for different spatial frequencies, wherein contributions to the correction term from different spatial frequencies are weighted differently.

25. The method of claim 17, wherein the interferometry system comprises a second interferometers which during operation monitors the second degree of freedom, wherein the correction term comprises information related to imperfections in interferometer optics of the second interferometer.

26. The method of claim 17, wherein the imperfections comprise bulk imperfections.

27. The method of claim 17, wherein the imperfections comprises surface imperfections.

28. The method of claim 17, wherein the imperfections in the interferometer optics result in an interferometric phase measured by the interferometry system that varies non-periodically and non-linearly as a function of a relative position of the measurement object along one of the first and second degrees of freedom.

29. The method of claim 17, wherein determining the correction term comprises determining a sum or difference of the monitored degrees of freedom where the contribution to the sum or difference from different spatial frequencies are weighted differently.

30. A method comprising:
    scanning a mirror surface relative to a pair of substantially parallel measurement axes of an interferometry system for a plurality of scan paths of different relative positions of the mirror surface along the measurement axes, the interferometry system comprising an interferometer including interferometer optics configured to direct a beam to reflect from the mirror;
    monitoring locations $X_1$ and $X_2$ of the mirror surface relative to the interferometric measurement axes with the interferometry system during the scanning;
    determining a profile of the mirror surface for each of the scan paths based on the monitored locations; and
    determining a correction term related to imperfections in the interferometer optics based on variations between the mirror profiles.

31. The method of claim 30, wherein determining the mirror profiles comprises determining an average slope of the mirror surface from $X_1$ and $X_2$ for a plurality of locations on the mirror surface for each of the scan paths.

32. The method of claim 31, wherein determining the mirror profile further comprises determining a fit to the average slope of the mirror surface for the plurality of locations.

33. The method of claim 32, wherein determining the mirror profile further comprises determining variations of the average slope from the fit.

34. The method of claim 31, wherein determining the correction term comprises performing an integral transform of the average slope of the mirror surface for the plurality of locations on the mirror surface.

35. The method of claim 34, wherein the integral transform provides information related to contributions to mirror surface variations from different spatial frequencies, and determining the correction term comprises weighting the contribution some spatial frequencies to the correction term differently than the contribution from other spatial frequencies.

36. The method of claim 30, wherein determining the mirror profile for each scan path comprises monitoring an orientation of the mirror surface with respect to the measurement axes during the scanning.

37. The method of claim 36, wherein determining the mirror profiles further comprises compensating the average slope of the mirror surface for the plurality of locations on the mirror surface for variations in the monitored orientation of the mirror surface.

38. The method of claim 30, wherein the scan paths are substantially orthogonal to the measurement axes.

39. The method of claim 30, wherein the mirror surface is scanned along one of the scan paths for a plurality of nominal rotation angles with respect to the measurement axes, and a mirror scan profile is determined for each of the nominal rotation angles.

40. A method comprising:
correcting measurements of a degree of freedom of a mirror relative to a first axis made using a first interferometer based on information that accounts for imperfections in interferometer optics of the first interferometer for different spatial frequencies, wherein the interferometer optics are configured to direct a beam to reflect from the mirror and contributions to the correction from the different spatial frequencies are weighted differently.

41. The method of claim 40, wherein a second interferometer monitors a degree of freedom of the mirror along a second axis parallel to and offset from the first axis, the second interferometer comprising interferometer optics configured to direct a beam to reflect from the mirror.

42. The method of claim 41, wherein the information accounts for imperfections in the interferometer optics of the second interferometer.

43. The method of claim 41, contributions to the correction from different spatial frequency components are weighted to increase the sensitivity of the correction to spatial frequency components near $K_d$ or harmonics of $K_d$, wherein $K_d$ corresponds to the $2\pi/d$ where d is a separation between the second and third axes.

44. An apparatus comprising:
an interferometer configured to monitor a location, $x_1$, of a mirror surface along a first axis, the interferometer comprising interferometer optics configured to direct a beam to reflect from the mirror surface; and
an electronic controller coupled to the interferometer and configured so that during operation the electronic controller determines a location of the mirror surface along a third axis based on $x_1$, a location, $x_2$, of the mirror surface along a second axis and a correction term, $\psi_3$, calculated from predetermined information comprising information characterizing imperfections in the interferometer optics.

45. The apparatus of claim 44, further comprising a second interferometer configured to monitor $x_2$.

46. The apparatus of claim 45, wherein the second interferometer comprises interferometer optics configured to direct a beam to reflect from the mirror surface and the correction term, $\psi_3$, is calculated from predetermined information comprising information characterizing imperfections in the optics of the second interferometer.

47. The apparatus of claim 45, wherein the correction term, $\psi_3$, is calculated from predetermined information comprising information characterizing imperfections in the mirror surface.

48. The apparatus of claim 44, wherein the first axis is substantially parallel to the second measurement axis.

49. The apparatus of claim 48, wherein the third axis is substantially parallel to the first axes and the second axis is located between the first and third axes.

50. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the apparatus of claim 44 for monitoring the position of the wafer relative to the imaged radiation.

51. A lithography system for use in fabricating integrated circuits on a wafer, the system comprising:
a stage for supporting the wafer; and
an illumination system including a radiation source, a mask, a positioning system, a lens assembly, and the apparatus of claim 44,
wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

52. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the apparatus of claim 44 for monitoring the position of the stage relative to the beam directing assembly.

53. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using an interferometry system, wherein monitoring the position of the stage comprises determining the location of an alignment mark on the stage using the method of claim 1.

54. A lithography method for fabricating integrated circuits on a wafer comprising:
positioning a first component of a lithography system relative to a second component of a lithography system to expose the wafer to spatially patterned radiation; and
monitoring the position of the first component relative to the second component using an interferometry system, wherein monitoring the position of the first component comprises determining the location of an alignment mark on the first component using the method of claim 1.

55. A method for fabricating integrated circuits, the method comprising:
applying a resist to a wafer;
forming a pattern of a mask in the resist by exposing the wafer to radiation using the lithography method of claim 53; and
producing an integrated circuit from the wafer.

56. A method for fabricating integrated circuits, the method comprising:
applying a resist to a wafer;
forming a pattern of a mask in the resist by exposing the wafer to radiation using the lithography method of claim 54; and
producing an integrated circuit from the wafer.

57. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using an interferometry system,
wherein monitoring the position of the stage comprises correcting a measurement of a degree of freedom of a measurement object associated with the stage using the method of claim 17.

58. A lithography method for fabricating integrated circuits on a wafer comprising:
positioning a first component of a lithography system relative to a second component of a lithography system to expose the wafer to spatially patterned radiation; and
monitoring the position of the first component relative to the second component using an interferometry system, wherein monitoring the position of the first component comprises correcting a measurement of a degree of freedom of a measurement object associated with the first component using the method of claim 17.

59. A method for fabricating a lithography mask, the method comprising:
directing a write beam to a substrate to pattern the substrate;
positioning the substrate relative to the write beam; and
monitoring the position of the substrate relative to the write beam using an interferometry system,
wherein monitoring the position of the substrate comprises correcting a measurement of a degree of freedom of a measurement object associated with the substrate using the method of claim 17.

\* \* \* \* \*